(12) United States Patent
Ito et al.

(10) Patent No.: US 9,692,014 B2
(45) Date of Patent: Jun. 27, 2017

(54) DISPLAY DEVICE

(71) Applicant: Japan Display Inc., Tokyo (JP)

(72) Inventors: Ryoichi Ito, Tokyo (JP); Toshihiro Sato, Tokyo (JP); Shigeru Sakamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/059,085

(22) Filed: Mar. 2, 2016

(65) Prior Publication Data

US 2016/0268358 A1    Sep. 15, 2016

(30) Foreign Application Priority Data

Mar. 10, 2015   (JP) .................................. 2015-046673

(51) Int. Cl.
*H01L 33/00*      (2010.01)
*H01L 51/52*      (2006.01)
*H01L 27/32*      (2006.01)

(52) U.S. Cl.
CPC ...... *H01L 51/5271* (2013.01); *H01L 27/3258* (2013.01); *H01L 51/5218* (2013.01); *H01L 27/3246* (2013.01); *H01L 2251/5315* (2013.01)

(58) Field of Classification Search
CPC ............. H01L 27/3262; H01L 27/3246; H01L 51/5271
USPC ............................................................ 257/98
See application file for complete search history.

(56) References Cited

U.S. PATENT DOCUMENTS

2003/0201716 A1 * 10/2003 Yamazaki ............ H01L 27/322
                                                              313/506
2004/0017153 A1    1/2004 Nishikawa
2014/0145157 A1 *  5/2014 Kim ........................ H01L 27/32
                                                                257/40

FOREIGN PATENT DOCUMENTS

JP          2003-257662 A     9/2003

* cited by examiner

*Primary Examiner* — David S Blum
(74) *Attorney, Agent, or Firm* — TYPHA IP LLC

(57) ABSTRACT

A display device includes a substrate; a transistor provided on the substrate; a first insulating film provided on the substrate and the transistor; a second insulating film provided on the first insulating film; an individual pixel electrode provided on the second insulating film; a light emitting layer provided on the individual pixel electrode; a common electrode provided on the light emitting layer; and a contact hole running through the first insulating film and the second insulating film and connecting a source or a drain of the transistor with the pixel electrode. The second insulating film has at least one recessed portion reaching the first insulating film; and the individual pixel electrode is provided along a top surface of the second insulating film and the first recessed portion.

17 Claims, 19 Drawing Sheets ated on Mar. 10, 2015, the entire contents of
DISPLAY DEVICE

CROSS REFERENCE TO RELATED APPLICATIONS

This application is based upon and claims the benefit of priority from the prior Japanese Patent Application No. 2015-046673 filed on Mar. 10, 2015, the entire contents of which are incorporated herein by reference.

FIELD

The present invention relates to a display device, and an embodiment disclosed by the present invention relates to a pixel structure of a display device.

BACKGROUND

An organic electroluminescence (hereinafter, referred to as "organic EL") display device includes a light emitting element provided in each of pixels and displays an image by controlling light emission of each of the light emitting elements independently. The light emitting element has a structure in which a layer containing an organic EL material (hereinafter, also referred to as a "light emitting layer") is interposed between a pair of electrodes, one of which is a lower electrode and the other of which is an upper electrode. In such an organic EL display device, one of the electrodes is provided in each pixel as an individual pixel electrode (also referred to simply as a "pixel electrode") and the other electrode is provided over a plurality of pixels as a common pixel electrode (also referred to as a "common electrode") supplied with a common potential. The organic EL display device provides a potential to the individual pixel electrode provided in each pixel independently, as opposed to the potential of the common pixel electrode, and thus controls the light emission of the pixels.

In order to improve the light emission luminance in such an organic EL display device, it is conceivable to increase the area size of the pixels. However, the area size of one pixel is naturally restricted by the size of the screen and the number of pixels. In order to avoid this, Japanese Laid-Open Patent Publication No. 2003-257662 discloses an organic EL display device in which a surface of an insulating film provided on a bottom surface of the pixel electrode has convexed and concaved portions in order to increase the effective area size of the pixel.

SUMMARY

A display device in an embodiment according to the present invention includes a substrate; a transistor provided on the substrate; a first insulating film provided on the substrate and the transistor; a second insulating film provided on the first insulating film; an pixel electrode provided on the second insulating film; a light emitting layer provided on the pixel electrode; a common electrode provided on the light emitting layer; and a contact hole running through the first insulating film and the second insulating film and connecting a source or a drain of the transistor with the pixel electrode. The second insulating film has at least one first recessed portion reaching the first insulating film; and the pixel electrode is provided along a top surface of the second insulating film and the first recessed portion.

DESCRIPTION OF EMBODIMENTS

Figure 1:
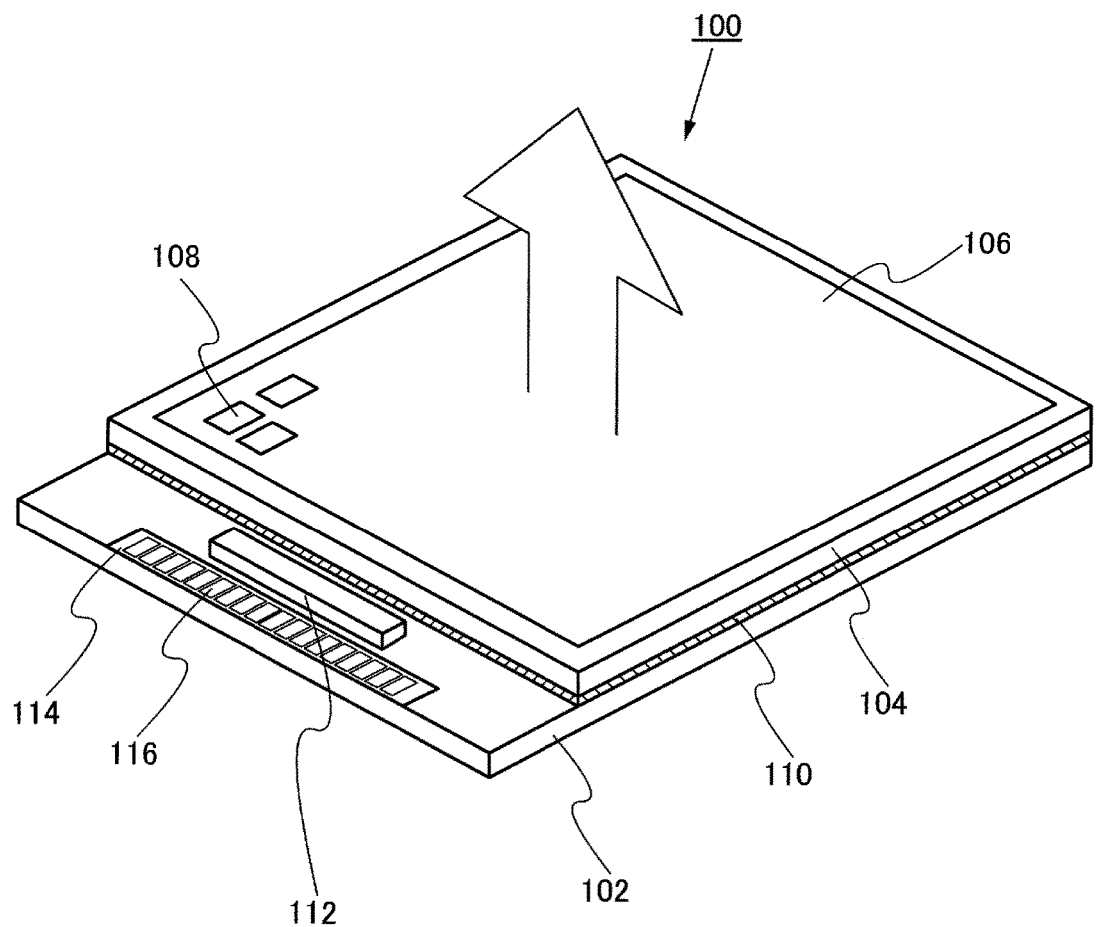
FIG. 1 is a perspective view showing a structure of a display device in an embodiment according to the present invention.

Hereinafter, embodiments of the present invention will be described with reference to the drawings and the like. The present invention may be carried out in various many embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely exemplary and do not limit the interpretations of the present invention in any way.

In the specification and the drawings, components that are substantially the same as those shown in a previous drawing(s) bear the identical reference signs thereto, and detailed descriptions thereof may be omitted.

In this specification, an expression that a component or area is "on" another component or area encompasses a case where such a component or area is in contact with the other component or area and also a case where such a component or area is above or below the other component or area, namely, a case where still another component or area is provided between such a component or area and the other component or area, unless otherwise specified.

Conventionally, it has been attempted to form convexed and concaved portions at a surface of an insulating film provided on a bottom surface of a pixel electrode in order to increase the effective area size of the light emission region. However, such conventional art merely forms convexed and concaved portions at the surface of the element. Such a structure still involves a problem of color mixing because of light that is output in a lateral direction, and does not provide a sufficiently high light extraction efficiency. In addition, a metal component in the light emission region reflects external light, which provides a problem that display performance is declined.

A spontaneous light-emitting display device such as an organic EL display device has problems to be solved that light that is output in a lateral direction is an ineffective component and thus prevents improvement of the light extraction efficiency and that in a system using color filters for a white organic EL element, light that is output in a lateral direction is a cause of optical color mixing.

Herein, the "optical color mixing" indicates the following phenomenon. A part of light that is emitted substantially isotropically in a transparent light emitting layer having a relatively high refractive index is totally reflected at an interface of the light emitting layer and thus does not go out of the light emitting layer. Light that is output from the light emitting element is partially propagated in the light emitting layer to be transmitted laterally, and thus is transmitted through a color filter in a pixel not corresponding thereto. As a result, an unintended color is generated.

In, for example, an organic EL display device, it is a factor preventing improvement of the light extraction efficiency that a part of light that is emitted substantially isotropically in a transparent light transmitting layer having a relatively high refractive index is totally reflected at an interface of the light emitting layer and thus does not go out of the light emitting layer.

The present invention made in light of such problems has an object of providing a display device having an improved light extraction efficiency. The present invention has an object of providing a display device that reduces color mixing. The present invention has an object of providing a display device that reduces reflection of external light. The present invention has an object of providing a display device including a light emitting element having a long life.

Embodiment 1

With reference to FIG. 1, a structure of a display device 100 in this embodiment will be described. The display device 100 includes a substrate 102 including a display region 106. The display region 106 includes an array of a plurality of pixels 108. On a top surface of the display region 106, a second substrate 104 is provided as a sealing member. The second substrate 104 is secured to the substrate 102 by a second sealing member 110 surrounding the display region 106. The display region 106 formed in the substrate 102 is sealed by the second substrate 104 acting as a sealing member and the sealing member 110 so as not to be exposed to air. Such a sealing structure suppresses light emitting elements provided in the pixels 108 from being deteriorated.

The substrate 102 includes a terminal region 114 along an end thereof. The terminal region 114 is located outer to the second substrate 104. The terminal region 114 includes a plurality of connection terminals 116. The connection terminals 116 form contacts that connect a device that outputs a video signal, a power supply and the like with a display panel. The contacts provided by the connection terminals 116 are exposed outside. The substrate 102 may include a driver circuit 112 that outputs a video signal input from the terminal region 114 to the display region 106.

Figure 2:
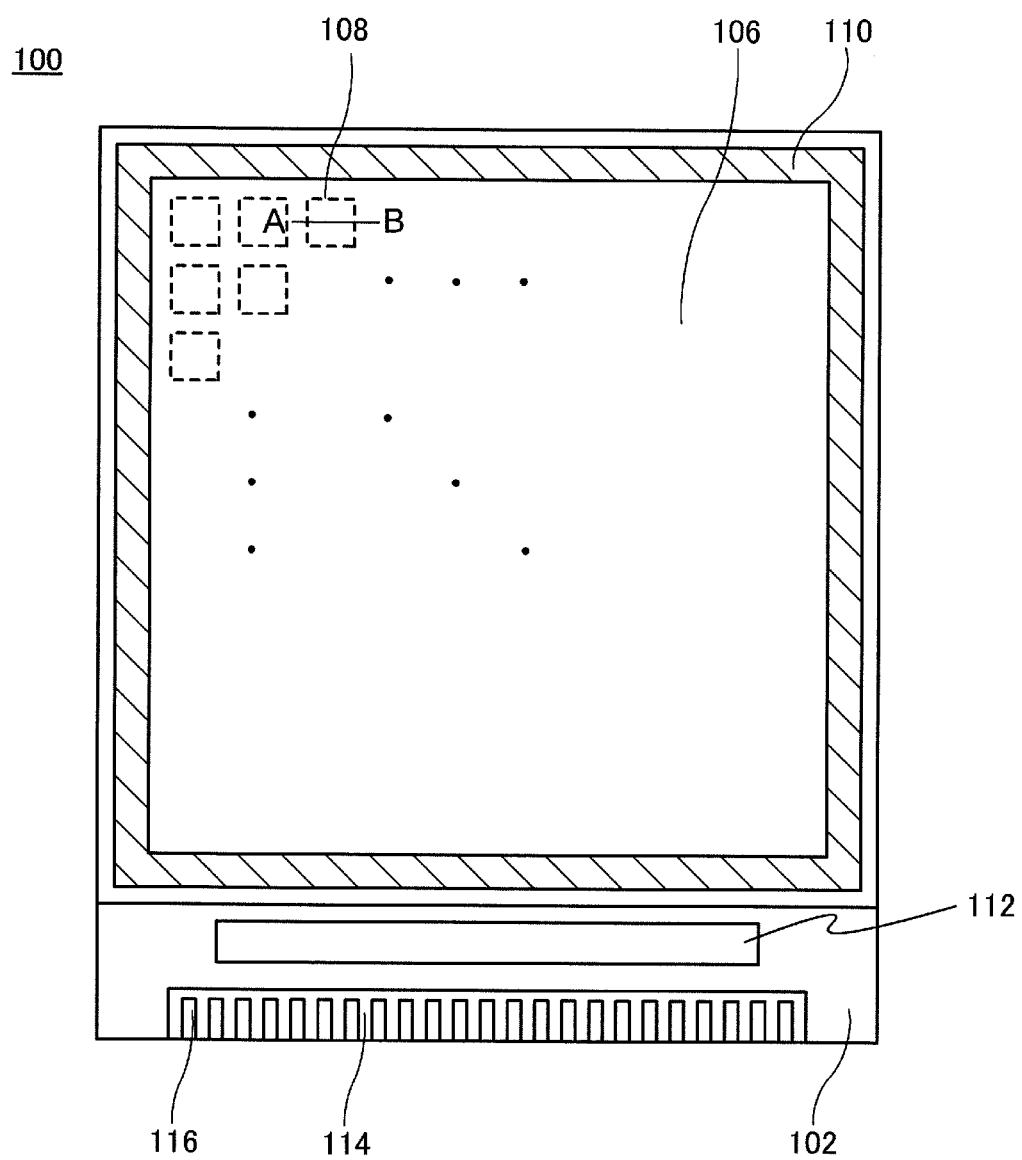
FIG. 2 is a plan view showing the structure of the display device in the embodiment according to the present invention.
Figure 3:
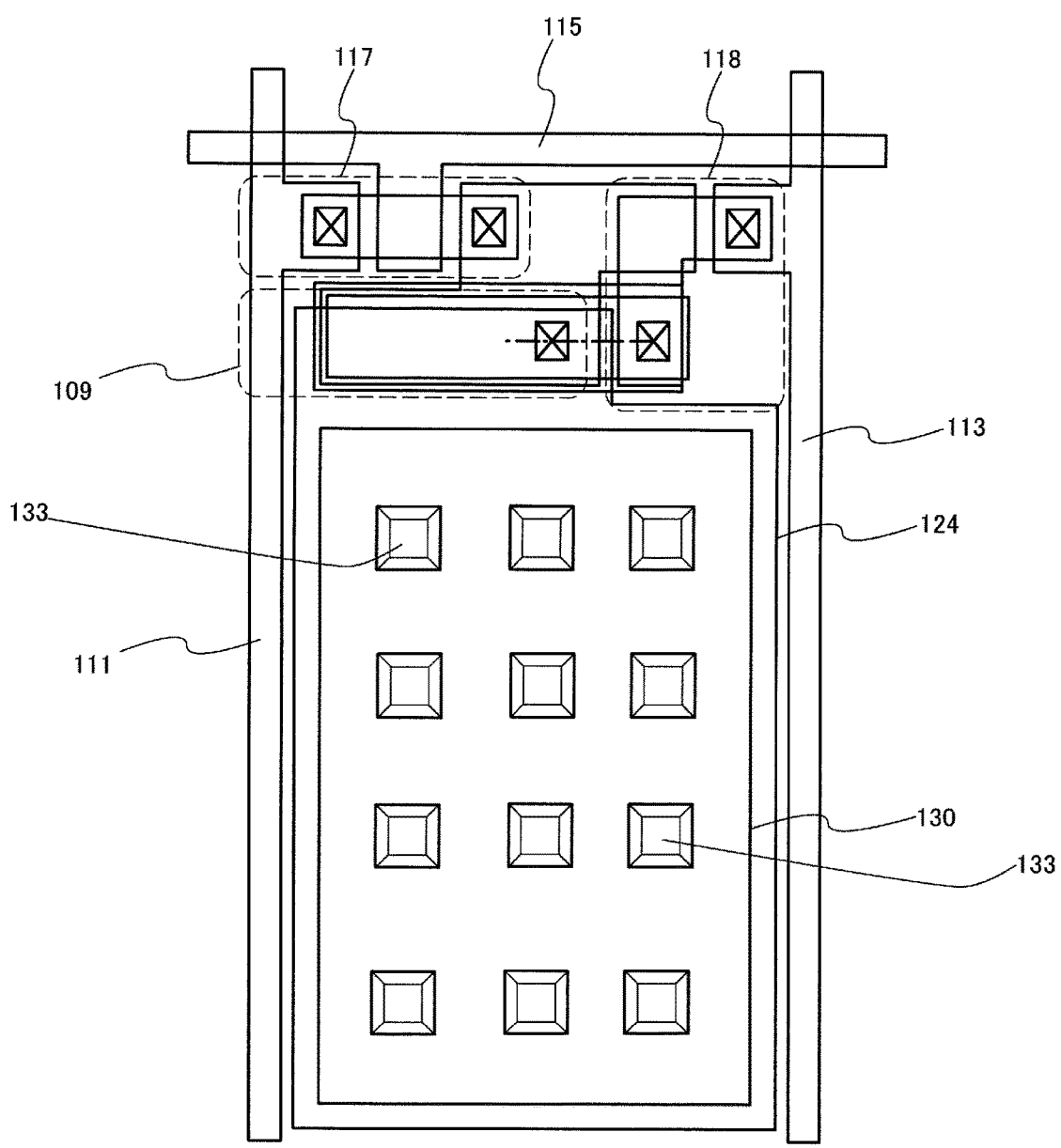
FIG. 3 is a plan view showing the structure of the display device in the embodiment according to the present invention.
Figure 4:
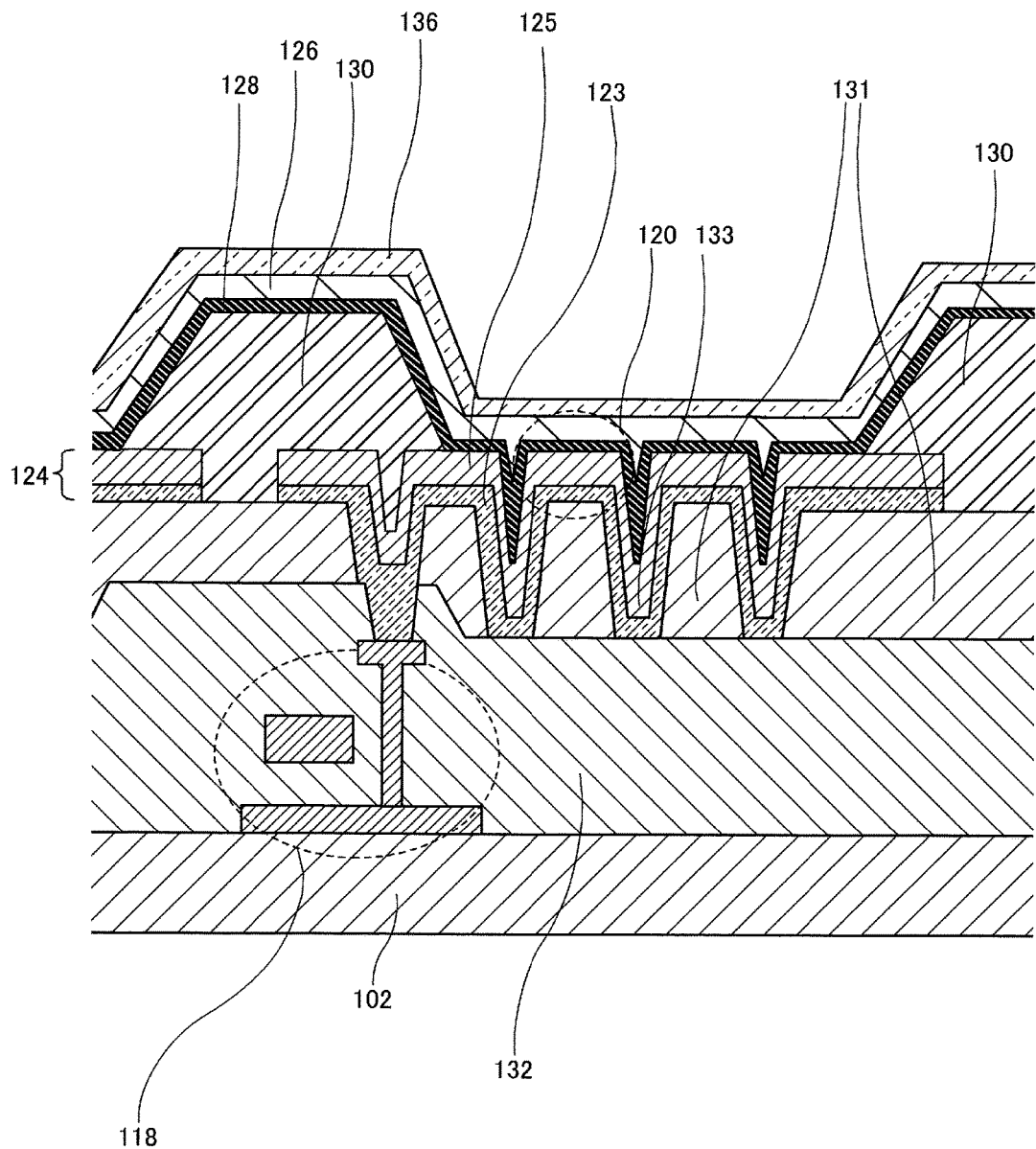
FIG. 4 is a cross-sectional view showing the structure of the display device in the embodiment according to the present invention.

With reference to FIG. 2 through FIG. 4, the structure of the display device 100 in this embodiment will be described. FIG. 2 is a plan view showing the structure of the display device 100 in this embodiment.

As shown in FIG. 2, the display region 106, of the substrate 102, which forms a display screen includes the plurality of pixels 108 arrayed in rows and columns. In a peripheral area of the substrate 102, other elements such as a vertical scanning circuit, a horizontal scanning circuit and the like that input signals to the display region 106 may be provided.

FIG. 3 is a plan view of a pixel 108. A selective transistor 117 is controlled on or off by a scanning line 115, which is supplied with a signal from a scanning line driving circuit. The selective transistor 117 reads a video signal from a data line 111 at a predetermined timing and supplies a voltage corresponding to the video signal to a gate of a driving transistor 118.

The gate voltage of the driving transistor 118 supplied by the selective transistor 117 is maintained by a capacitance portion 109. The driving transistor 118 includes a drain connected with a power supply line 113 and a source connected with a pixel electrode 124. An organic electroluminescence element has a light emission time period or a light emission strength controlled by an electric current (drain current) controlled by the gate potential of the driving transistor 118.

FIG. 3 shows a plurality of recessed portions 133 in this embodiment, which will be described in detail later.

FIG. 4 shows a cross-sectional structure of the display region 106 of the display device 100 taken along line A-B in FIG. 2.

As shown in FIG. 4, the plurality of pixels 108 in the display region 106 each include the transistor 118 and a light emitting element 120. In the case of, for example, being an organic light emitting element, the light emitting element 120 has a structure in which a light emitting layer 128 containing an organic EL material is interposed between the individual pixel electrode (also referred to simply as the "pixel electrode") 124 and a common pixel electrode (upper electrode, common electrode) 126 provided to face the individual pixel electrode 124. One individual pixel electrode 124 is independently provided in each pixel and is connected with the transistor 118.

The individual pixel electrode 124 is preferably formed of a metal film having a high reflectance in order to allow light generated in the light emitting layer 128 to be reflected toward the common pixel electrode 126. Alternatively, the individual pixel electrode 124 may have a stack structure of a metal film 123 (e.g., Ag film) and a light-transmissive conductive film (lower electrode) 125, so that the individual pixel electrode 124 includes a light reflecting surface. In the examples and drawings described and referred to below, the individual pixel electrode 124 includes the metal film 123 and the light-transmissive conductive film 125. The present invention is not limited to having such a structure.

Between two adjacent pixels 108, a bank 130 is provided. The bank 130 is provided such that an end thereof covers a peripheral area of the individual pixel electrode 124.

The bank 130 is provided in order to prevent the light emitting layer 128 from short circuiting with the common pixel electrode 126 as a result of not being sufficiently covered at an end of the individual pixel electrode 124 and in order to insulate the adjacent pixels 108 from each other. Therefore, the bank 130 is preferably formed of an insulating material. For example, the bank 130 is preferably formed of an organic material such as polyimide, an acrylic resin or the like, or an inorganic material such as silicon oxide or the like.

The light emitting layer 128 is commonly provided for the plurality of pixels 108 and covers the individual pixel electrodes 124 and the bank 130 between the pixels 108.

The light emitting layer 128 is formed of a light emitting organic material of a low molecular weight type or a high molecular weight type. In the case where an organic material of a low molecular weight type is used, the light emitting layer 128 is provided between a hole injection layer/hole transfer layer and an electron transfer layer/electron injection layer. In this embodiment, the light emitting layer 128 is formed of a light emitting material that emits white light, and color display is realized by color filters 122.

The common pixel electrode 126 is preferably formed of a transparent conductive material that is light-transmissive and conductive such as ITO (tin oxide-containing indium oxide), IZO (indium oxide—zinc oxide) or the like in order to allow light emitted in the light emitting layer 128 to be transmitted through the common pixel electrode 126. Alternatively, the common pixel electrode 126 may be formed of a metal layer having such a thickness that allows the light emitted in the light emitting layer 128 to be transmitted through the metal layer.

A first insulating film 132 is provided so as to cover the transistor 118. The first insulating film 132 may be referred to also as a "flattening film" or an "interlayer insulating layer". The first insulating film 132 is formed of an organic material such as, for example, a photosensitive acrylic resin or the like. On the first insulating film 132, a second insulating film 131 is provided. The second insulating film 131 has the plurality of recessed portions 133. The recessed portions 133 may have a certain curvature. The second insulating film 131 may be formed of an organic material. Especially preferable organic materials usable for the second insulating film 131 include a polyimide resin, an acrylic resin, an epoxy resin, a silicone resin, a fluorine resin and a siloxane resin.

On the second insulating film 131, the metal film 123 is provided as a reflective film, and the reflective film 123 also has recessed portions.

A contact hole 119 is provided so as to run through the second insulating film 131. The contact hole 119 connects the transistor 118 and the reflective film 123 with each other. In this embodiment, there is no specific limitation on the form of the transistor 118. The transistor 118 may be a thin film transistor including a channel formed in a semiconductor film.

In FIG. 4, the recessed portions 133 run through the second insulating film 131. In the case where, for example, the second insulating film 131 has a thickness of about 1 µm or greater and about 10 µm or less, the recessed portions 133 also have a depth of about 1 µm or greater and about 10 µm or less. It is not absolutely necessary that the recessed portions 133 run through the entire thickness of the second insulating film 131.

In FIG. 4, three recessed portions 133 are provided in one pixel 108. The number of the recessed portions 133 is not limited to three, and each pixel 108 may have one or a plurality of recessed portions 133.

On the common pixel electrode 126, a protective film 136 is provided. The protective film 136 is preferably formed of an inorganic material such as silicon nitride ($Si_xN_y$), silicon nitride oxide ($Si_xN_yO_z$), silicon oxide ($SiO_x$) or the like.

On the protective film 136, another protective film (not shown) may be provided. In other words, the protective film 136 may include a plurality of films. The other protective film is preferably an insulating film that blocks entrance of moisture. Such an insulating film may be an inorganic insulating film or an organic insulating film.

The other protective film may be formed of, for example, an inorganic insulating material such as silicon oxide ($SiO_x$), silicon nitride ($Si_xN_y$), silicon oxide nitride ($Si_xO_yN_z$), silicon nitride oxide ($Si_xN_yO_z$), aluminum oxide ($Al_xO_y$), aluminum nitride ($Al_xN_y$), aluminum oxide nitride ($Al_xO_yN_z$), aluminum nitride oxide ($Al_xN_yO_z$) or the like (x and y are each an arbitrary value). The other protective film may have a stack structure of any of these materials. The other protective film formed of such an inorganic material(s) may be formed by plasma CVD or sputtering.

Alternatively, the other protective film may be formed of an organic insulating material such as a polyimide resin, an acrylic resin, an epoxy resin, a silicone resin, a fluorine resin, a siloxane resin or the like. The other protective film may have a stack structure of any of these materials. The other protective film formed of such an organic material(s) may be formed by vapor deposition or vapor deposition polymerization.

The other protective film or the protective film 136 formed of a plurality of films may have a stack structure of a combination of any of the above-described inorganic and organic insulating materials.

The substrate 102 is covered with the second substrate 104 (see FIG. 1), which is transparent and is kept away from the substrate 102 by the sealing member 110 (see FIG. 1). A space enclosed by the second substrate 104, the sealing member 110, and the protective film 136 is filled with a transparent filler material (not shown).

In this embodiment, the first insulating film 132 and the second insulating film 131 are provided between the transistor 118 and the light emitting element 120. This allows the recessed portions 133 that are sufficiently deep to run through the second insulating film 131 to be provided. As a result, large convexed and concaved portions are provided.

In this embodiment, the transistor 118 and the light emitting element 120 are insulated, except for a contact portion thereof, from each other by the first insulating film 132, and large convexed and concaved portions are formed in the second insulating film 131 in the pixel 108. This allows the individual pixel electrode 124 (reflective film 123) to be formed along the convexed and concaved portions. Therefore, the amount of light that is scattered is increased, and thus the light extraction efficiency is improved.

The contact hole and the convexed and concaved portions are formed in the second insulating film 131 in the same step. Therefore, the convexed and concaved portions are made high in correspondence with the depth of the contact hole 119. This increases the amount of light that is scattered and thus improves the light extraction efficiency, and decreases the amount of external light that is reflected.

In addition, the light that is emitted in the recessed portions 133 is not output in a lateral direction (left-right direction in the cross-sectional structure shown in FIG. 4). Therefore, in a system in which a white organic light emitting element and color filters are combined, optical color mixing is decreased.

Manufacturing Method of the Display Device in Embodiment 1

With reference to FIG. 5 through FIG. 11, a manufacturing method of the display device 100 in this embodiment will be described.

Figure 5:
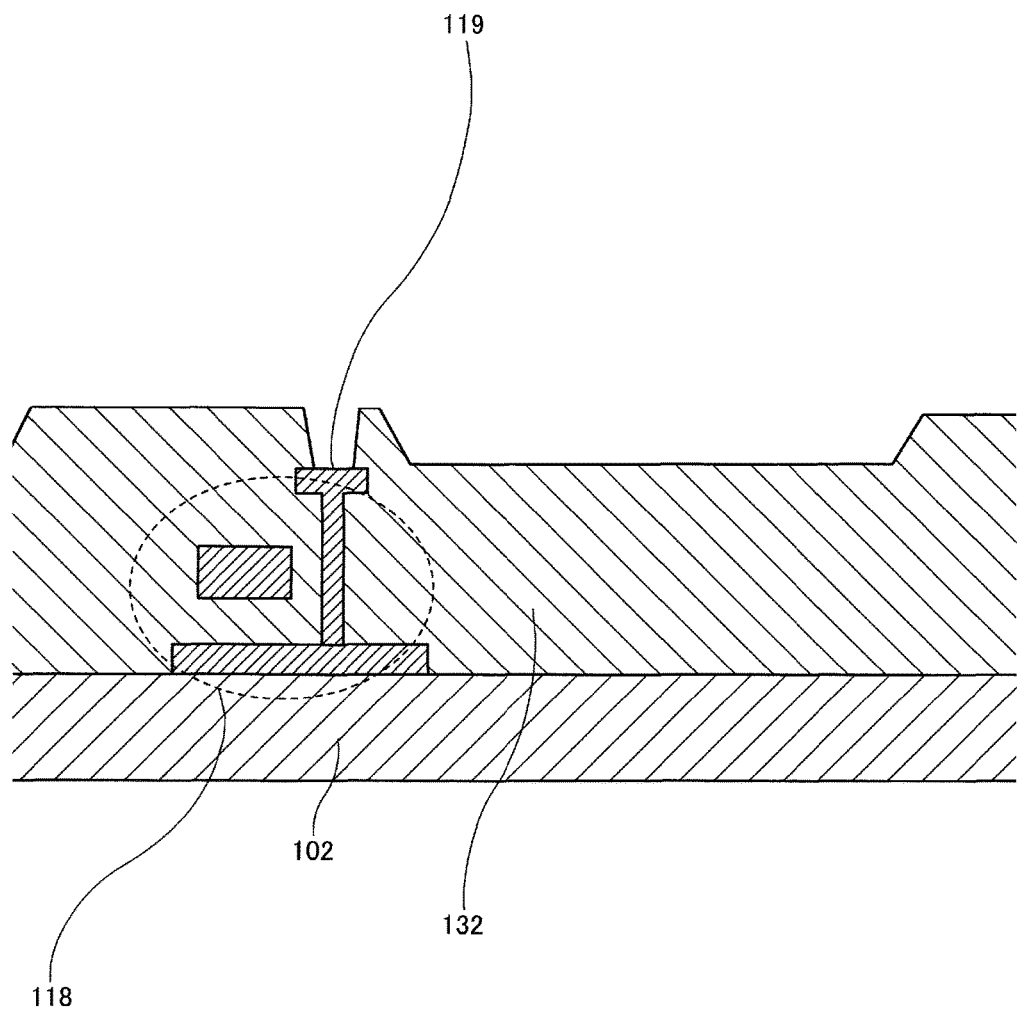
FIG. 5 is a cross-sectional view illustrating a manufacturing method of the display device in the embodiment according to the present invention.

FIG. 5 is a cross-sectional view obtained when a step of forming the first insulating film 132 is finished. Steps up to this step include a step of forming the transistor 118 and the like necessary to form a pixel circuit.

First, the pixel circuit is formed on the substrate 102. At this point, the scanning line driving circuit, a video signal line driving circuit, an input terminal portion and the like are formed as necessary. Elements included in the pixel circuit, for example, the transistor, a capacitor and the like are formed by repeating a step of stacking thin films of a semiconductor material, an insulating material and a metal material and a step of patterning performed by use of photolithography.

Next, the first insulating film 132 is formed on the substrate 102. The first insulating film 132 is etched by photolithography or the like to form a contact hole 119 running through the first insulating film 132 (FIG. 5).

Figure 6:
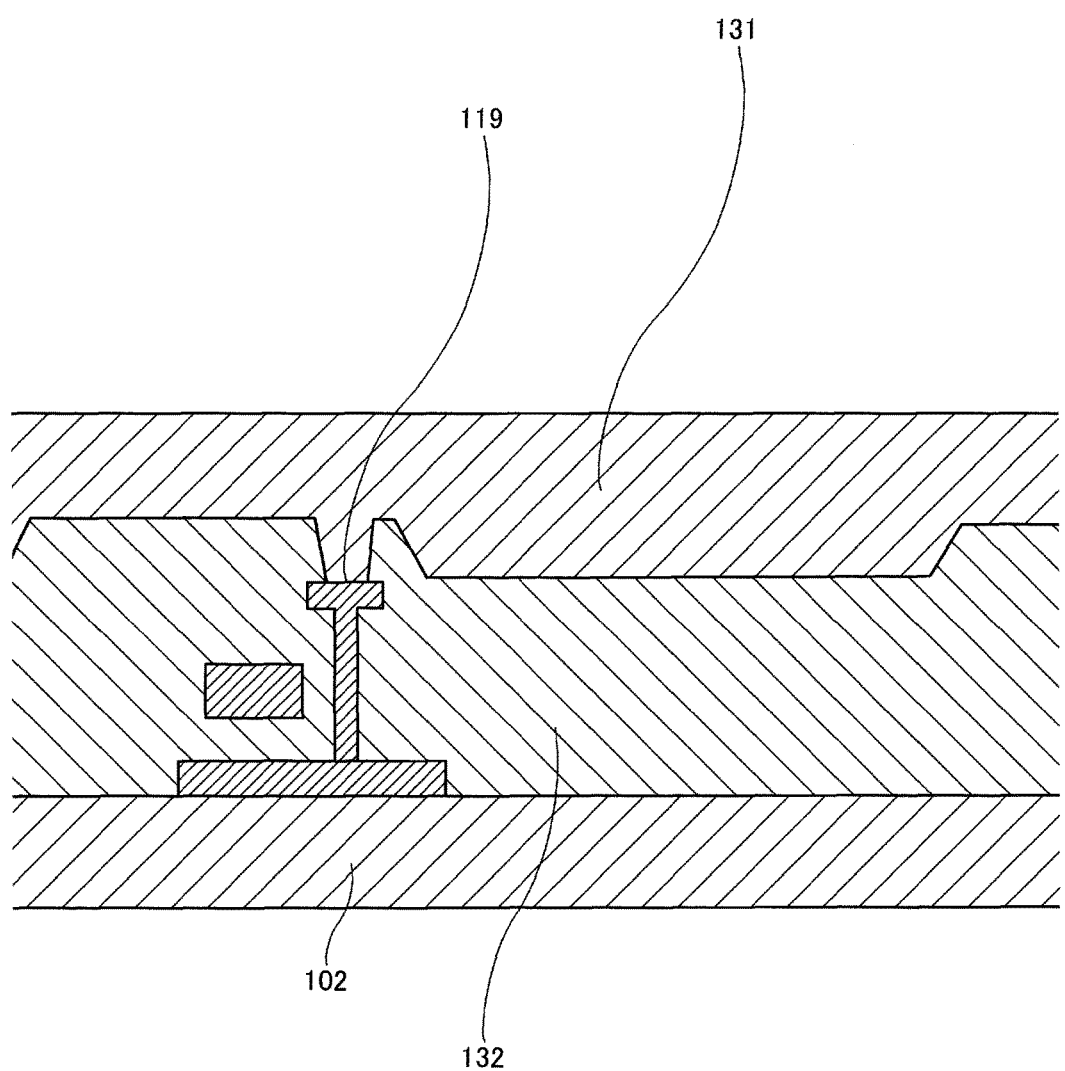
FIG. 6 is a cross-sectional view illustrating the manufacturing method of the display device in the embodiment according to the present invention.

Next, the second insulating film 131 is formed (FIG. 6). In FIG. 6, the second insulating film 131 is formed so as to bury the contact hole 119. Alternatively, the second insulating film 131 may be formed so as not to bury the contact hole 119.

Figure 7:
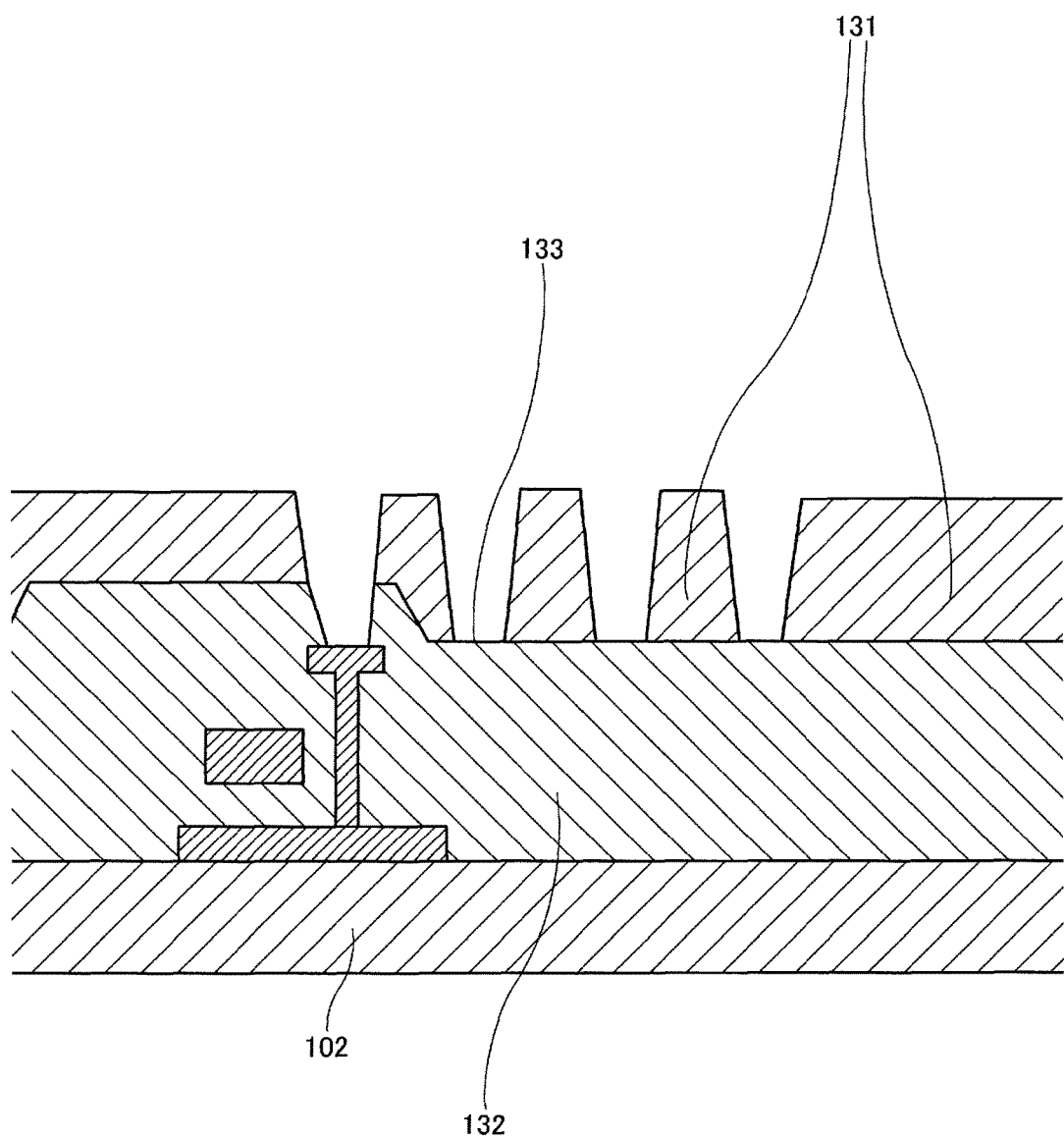
FIG. 7 is a cross-sectional view illustrating the manufacturing method of the display device in the embodiment according to the present invention.

The second insulating film 131 is etched by photolithography or the like to extend the contact hole 119 such that the contact hole 119 runs through the second insulating film 131 as well as the first insulating film 132 and also to form the recessed portions 133 running through the second insulating film 131 (FIG. 7). The contact hole 119 is extended and the recessed portions 133 are formed in the same step. Alternatively, the second insulating film 131 may be formed of a photosensitive material, so that the contact hole 119 is extended and the recessed portions 133 are formed in the same step by photolithography.

It is preferable that the first insulating film 132 and the second insulating layer 133 are different from each other in ease of etching. It is more preferable that the first insulating film 132 is formed of a material that is difficult to be etched. With such a structure, the contact hole 119 may be extended in the same step as the formation of the recessed portions 133 while the depth of the recessed portions 133 is controlled. In the case where the second insulating film 131 is formed of a photosensitive material also, the contact hole 119 may be extended in the same step as the formation of the recessed portions 133 while the depth of the recessed portions 133 is controlled.

Figure 8:
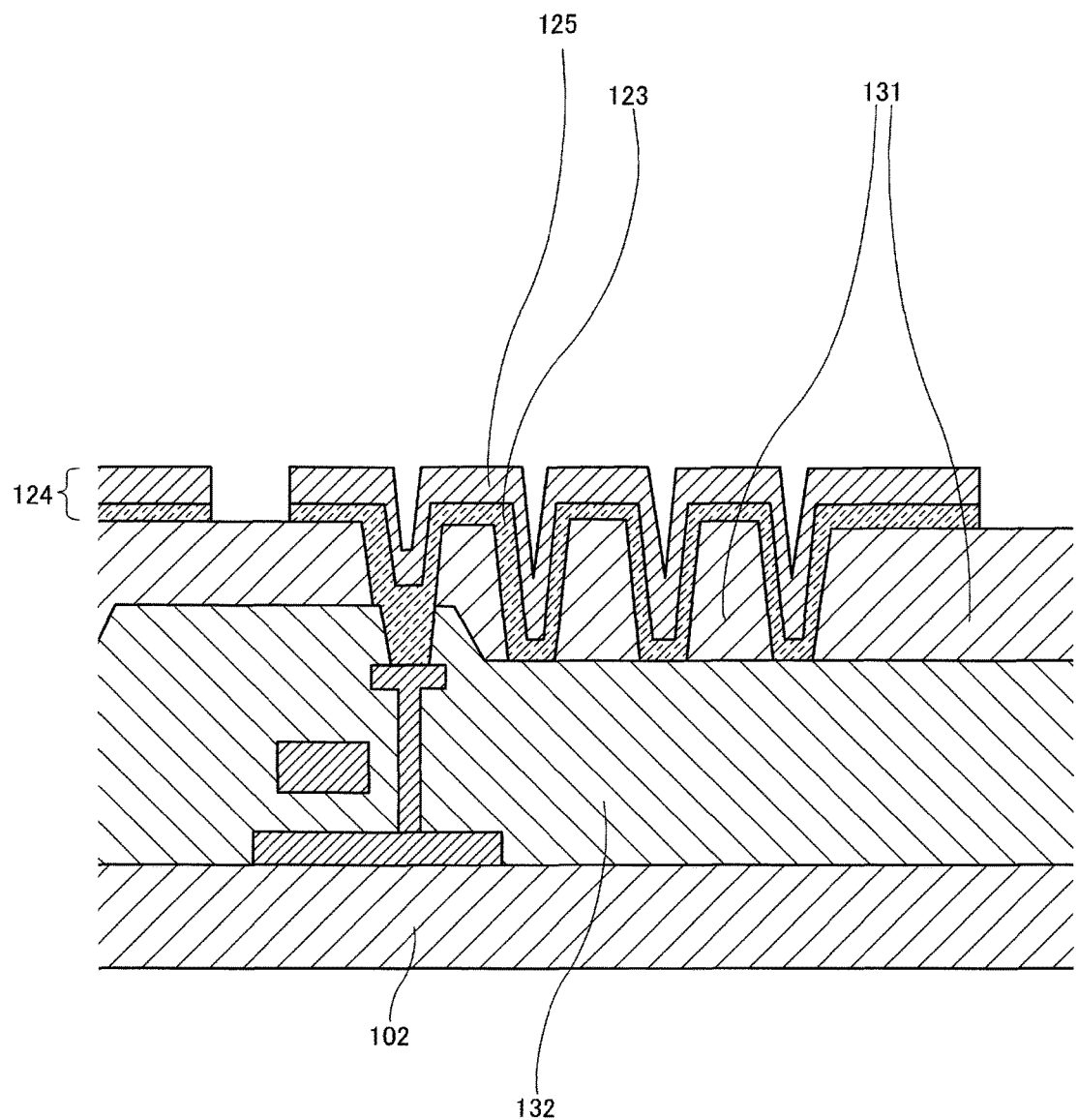
FIG. 8 is a cross-sectional view illustrating the manufacturing method of the display device in the embodiment according to the present invention.

On the first insulating film 132 and the second insulating film 131, the individual pixel electrode 124 including the reflective film 123 and the light-transmissive conductive film 125 is formed so as to fill the contact hole 119 and the recessed portions 133. In addition, the reflective film 123 is formed so as to have recessed portions (FIG. 8).

The individual pixel electrode 124 is formed by photolithography. The individual pixel electrode 124 is preferably formed of a metal film having a high reflectance in order to allow light generated in the light emitting layer 128 to be reflected toward the common pixel electrode 126. Alternatively, the individual pixel electrode 124 may have a stack structure of the metal film 123 and the light-transmissive conductive film 125 as in this embodiment, so that the individual pixel electrode 124 includes a light reflecting surface.

Figure 9:
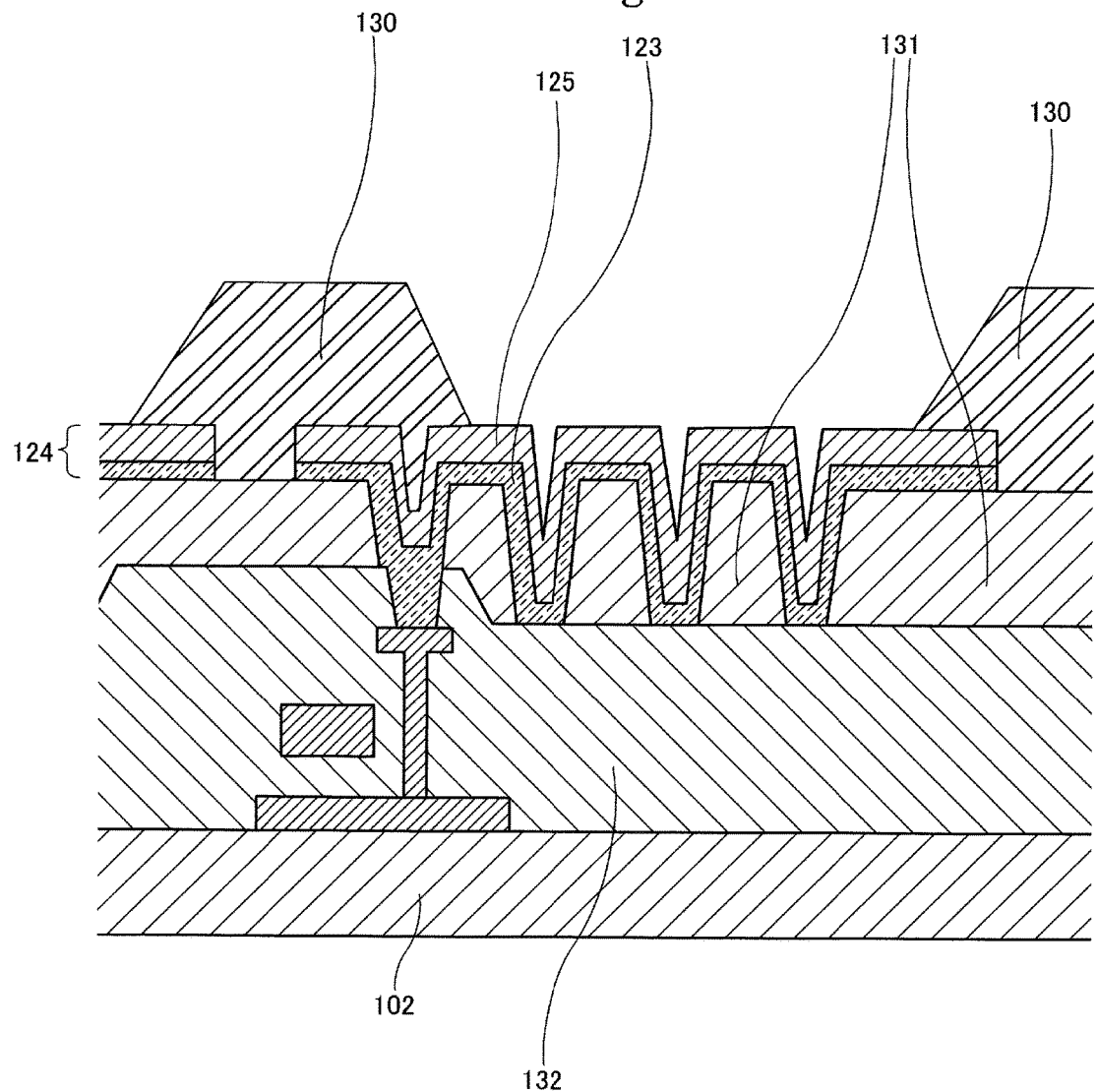
FIG. 9 is a cross-sectional view illustrating the manufacturing method of the display device in the embodiment according to the present invention.

Two adjacent pixels 108 are demarcated from each other, and the bank 130 is formed such that an end of the bank 130 covers a peripheral area of the individual pixel electrode 124 (FIG. 9). The bank 130 is formed of an insulating material. The insulating material may be an organic material or an inorganic material. Preferably usable organic materials include polyimide, an acrylic resin and the like. Preferably usable inorganic materials include silicon oxide and the like.

Figure 10:
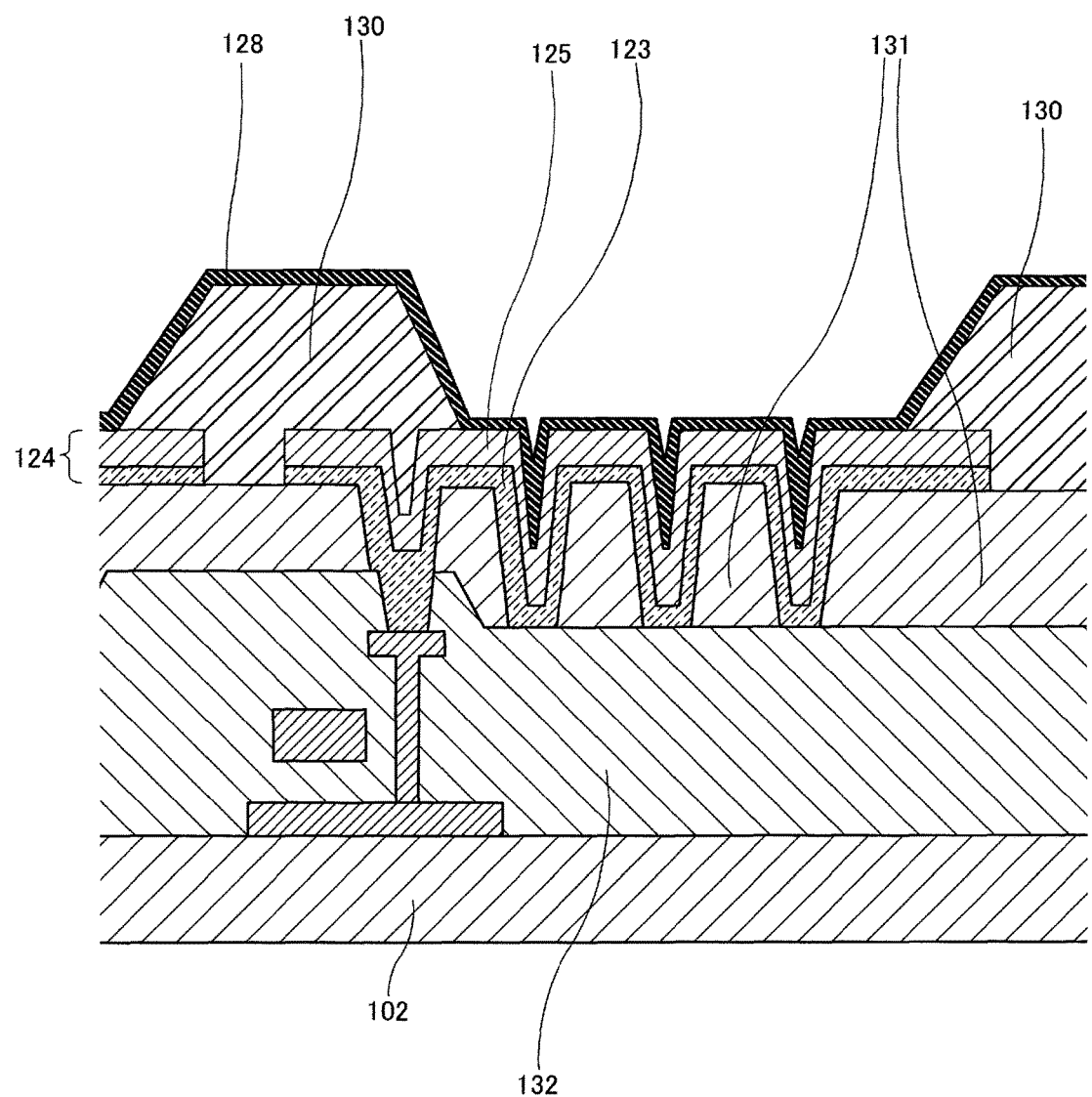
FIG. 10 is a cross-sectional view illustrating the manufacturing method of the display device in the embodiment according to the present invention.

On the resultant structure, the light emitting layer 128 is formed (FIG. 10). In this embodiment, merely the light emitting layer 128 is formed on the resultant structure. Alternatively, in the case where the light emitting element 120 is an organic EL element, functional layers such as, for example, an electron injection layer, an electron transfer layer, a hole injection layer and a hole transfer layer may also be formed by vapor deposition by use of the same vapor deposition mask as used for forming the light emitting layer 128.

Figure 11:
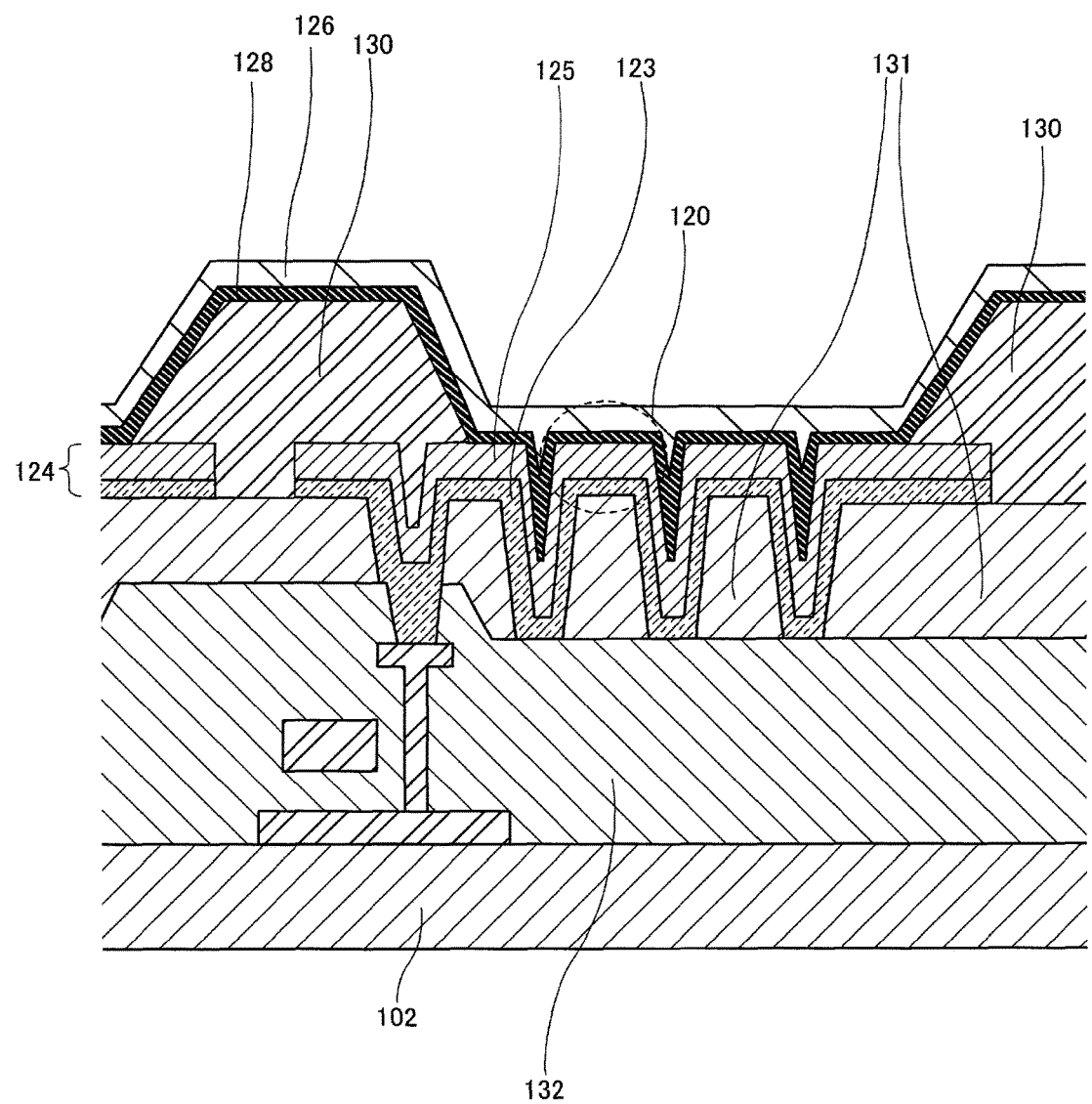
FIG. 11 is a cross-sectional view illustrating the manufacturing method of the display device in the embodiment according to the present invention.

On the light emitting layer 128, the common pixel electrode 126, which is an upper electrode, is formed (FIG. 11). The common pixel electrode 126 is preferably formed of a transparent conductive material that is light-transmissive and conductive such as ITO (tin oxide-containing indium oxide), IZO (indium oxide—zinc oxide) or the like in order to allow light emitted in the light emitting layer 128 to be transmitted through the common pixel electrode 126. In this embodiment, the common pixel electrode 126 is formed of ITO. On the common pixel electrode 126, the protective film 136 is formed. Thus, the manufacturing of the structure shown in FIG. 4 is finished.

In this embodiment, the first insulating film 132 and the second insulating film 131 are provided between the transistor 118 and the light emitting element 120. This allows the recessed portions 133 that are sufficiently deep to run through the second insulating film 131 to be provided. As a result, large convexed and concaved portions are provided.

Embodiment 2

Figure 12:
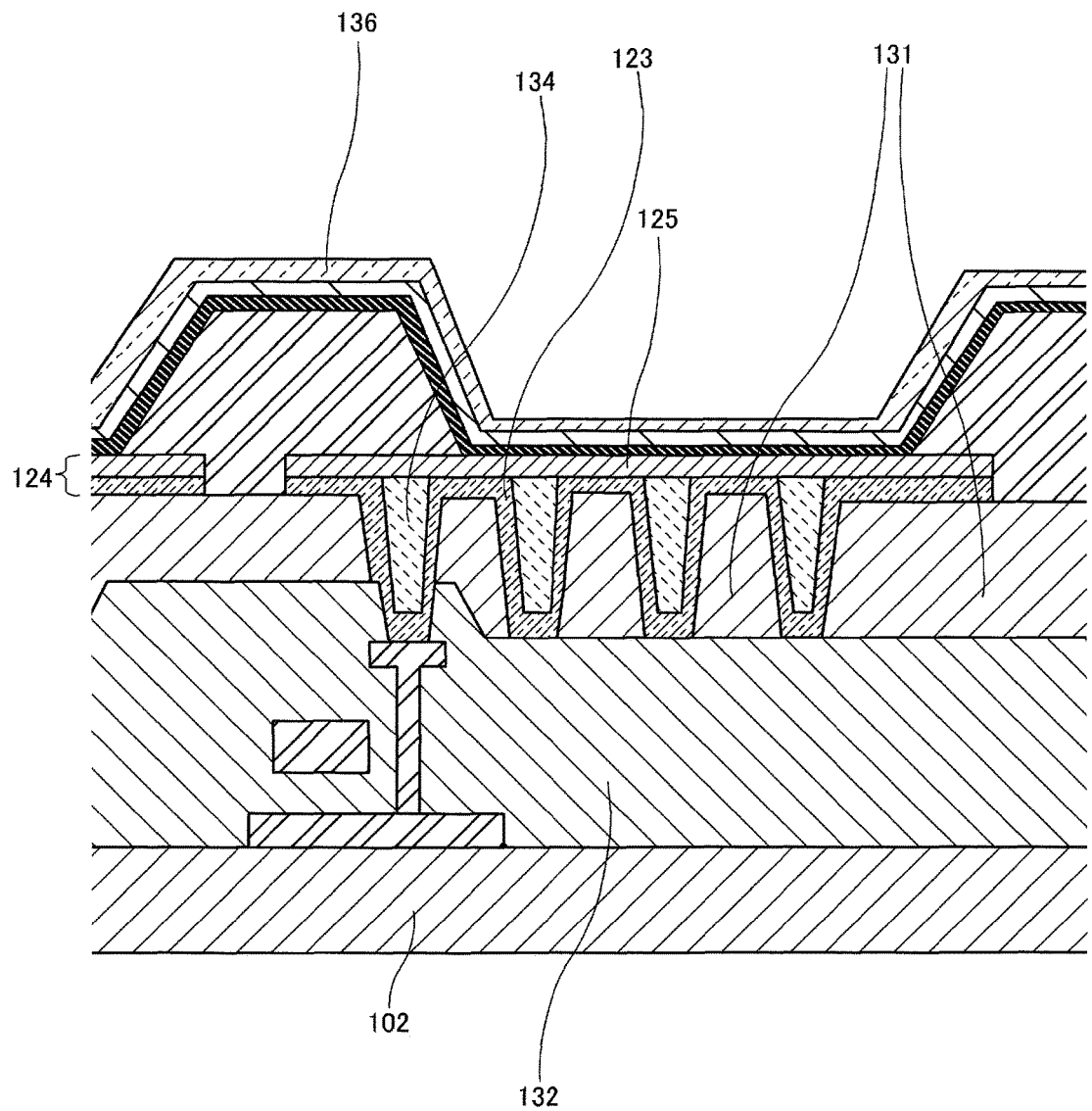
FIG. 12 is a cross-sectional view illustrating a manufacturing method of a display device in an embodiment according to the present invention.

As shown in FIG. 12, a recessed portion filling film (third insulating film) 134 may be provided between the reflective film 123 and the light-transmissive conductive film 125 of the individual pixel electrode 124, in order to flatten the light-transmissive conductive film 125. The recessed portion filling film 134 is formed of, for example, an organic insulating material.

The first insulating 132, the common electrode 126, the protective film 136 and the like are as described in embodiment 1.

Manufacturing Method of the Display Device in Embodiment 2

With reference to FIG. 13 through FIG. 17 and FIG. 12, a manufacturing method of a display device 100 in this embodiment will be described.

Figure 13:
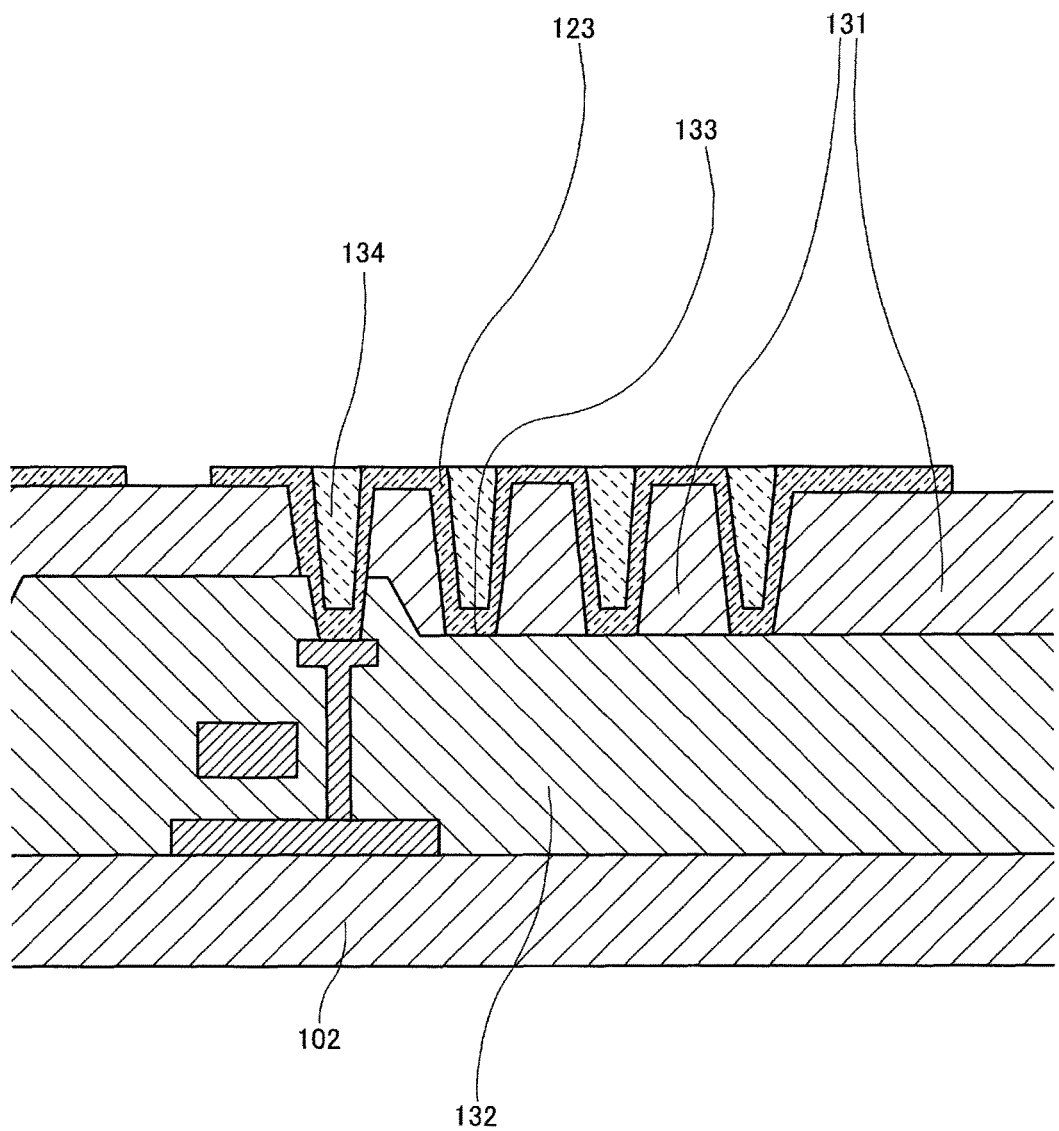
FIG. 13 is a cross-sectional view illustrating the manufacturing method of the display device in the embodiment according to the present invention.

FIG. 13 is a cross-sectional view obtained when steps of forming the reflective film 123 and the recessed portion filling film 134 after the recessed portions 133 are formed are finished. Steps up to the formation of the recessed portions 133 are the same as those in embodiment 1.

First, the pixel circuit is formed on the substrate 102. At this point, the scanning line driving circuit, a video signal line driving circuit, an input terminal portion and the like are formed as necessary. Elements included in the pixel circuit, for example, the transistor, a capacitor and the like are formed by repeating a step of stacking thin films of a semiconductor material, an insulating material and a metal material and a step of patterning performed by use of photolithography.

Next, the first insulating film 132 is formed on the substrate 102. The first insulating film 132 is etched by photolithography or the like to form the contact hole 119 running through the first insulating film 132.

Next, the second insulating film 131 is formed. In FIG. 6 corresponding to this step, the second insulating film 131 is formed so as to bury the contact hole 119. Alternatively, the second insulating film 131 may be formed so as not to bury the contact hole 119.

The second insulating film 131 is etched by photolithography or the like to extend the contact hole 119 such that the contact hole 119 runs through the second insulating film 131 as well as the first insulating film 132, and also to form the recessed portions 133 running through the second insulating film 131. The contact hole 119 is extended and the recessed portions 133 are formed in the same step. Alternatively, the second insulating film 131 may be formed of a photosensitive material, so that the contact hole 119 is extended and the recessed portions 133 are formed in the same step by photolithography.

It is preferable that the first insulating film 132 and the second insulating layer 133 are different from each other in ease of etching. It is more preferable that the first insulating film 132 is formed of a material that is difficult to be etched. With such a structure, the contact hole 119 may be extended in the same step as the formation of the recessed portions 133 while the depth of the recessed portions 133 is controlled. In the case where the second insulating film 131 is formed of a photosensitive material also, the contact hole 119 may be extended in the same step as the formation of the recessed portions 133 while the depth of the recessed portions 133 is controlled.

On the first insulating film 132 and the second insulating film 131, the reflective film 123 is formed so as to be in contact with walls of the contact hole 119 and walls of the recessed portions 133, more specifically, so as to have recessed portions along the contact hole 119 and the recessed portions 133 (FIG. 13).

The recessed portion filling film 134 is formed on the reflective film 123 so as to fill the recessed portions of the reflective film 123. This step may include a step of flattening the recessed portion filling film 134 by etching.

Figure 14:
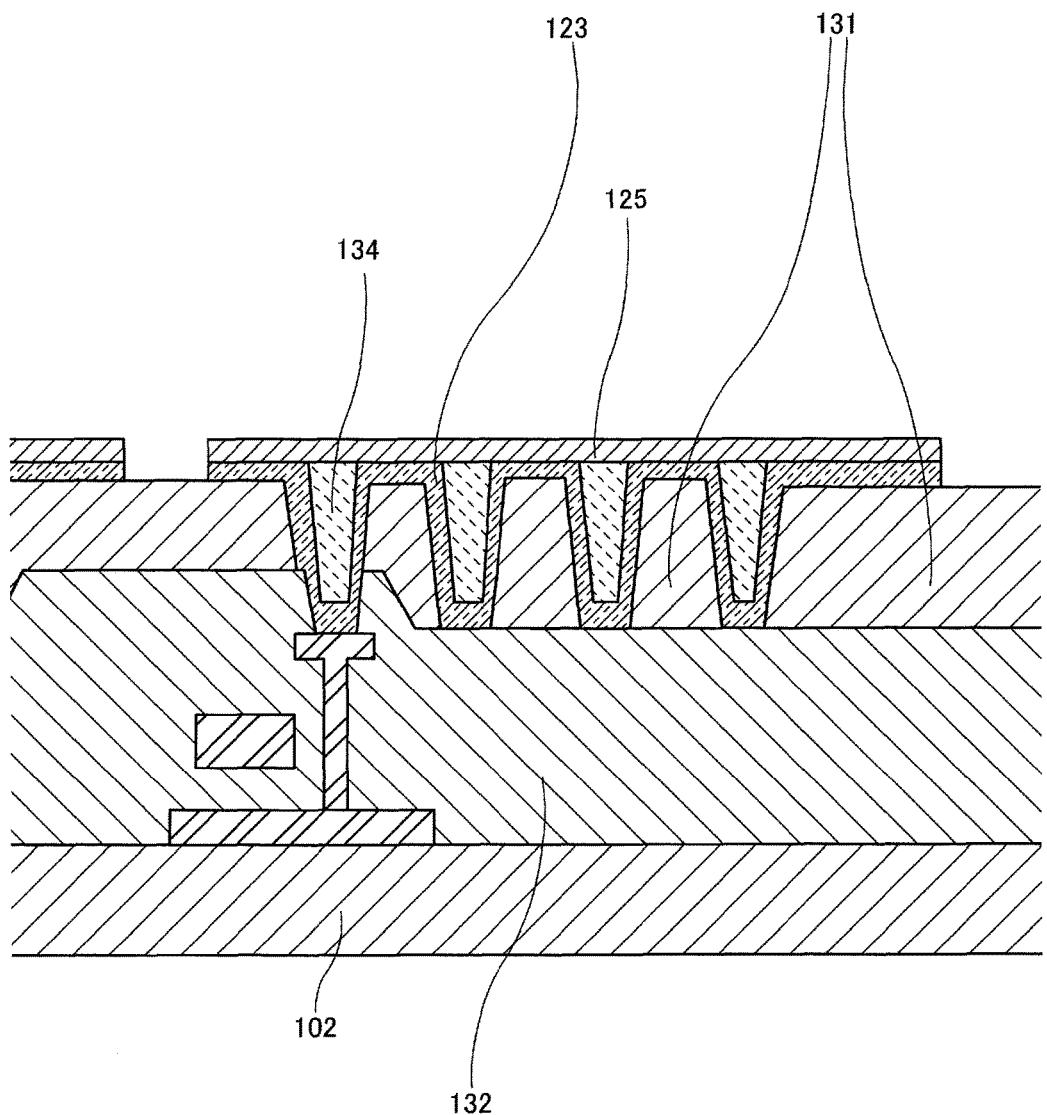
FIG. 14 is a cross-sectional view illustrating the manufacturing method of the display device in the embodiment according to the present invention.

On the reflective film 123 and the flattened surface of the recessed portion filling film 134, the light-transmissive conductive film 125 is formed (FIG. 14).

Figure 15:
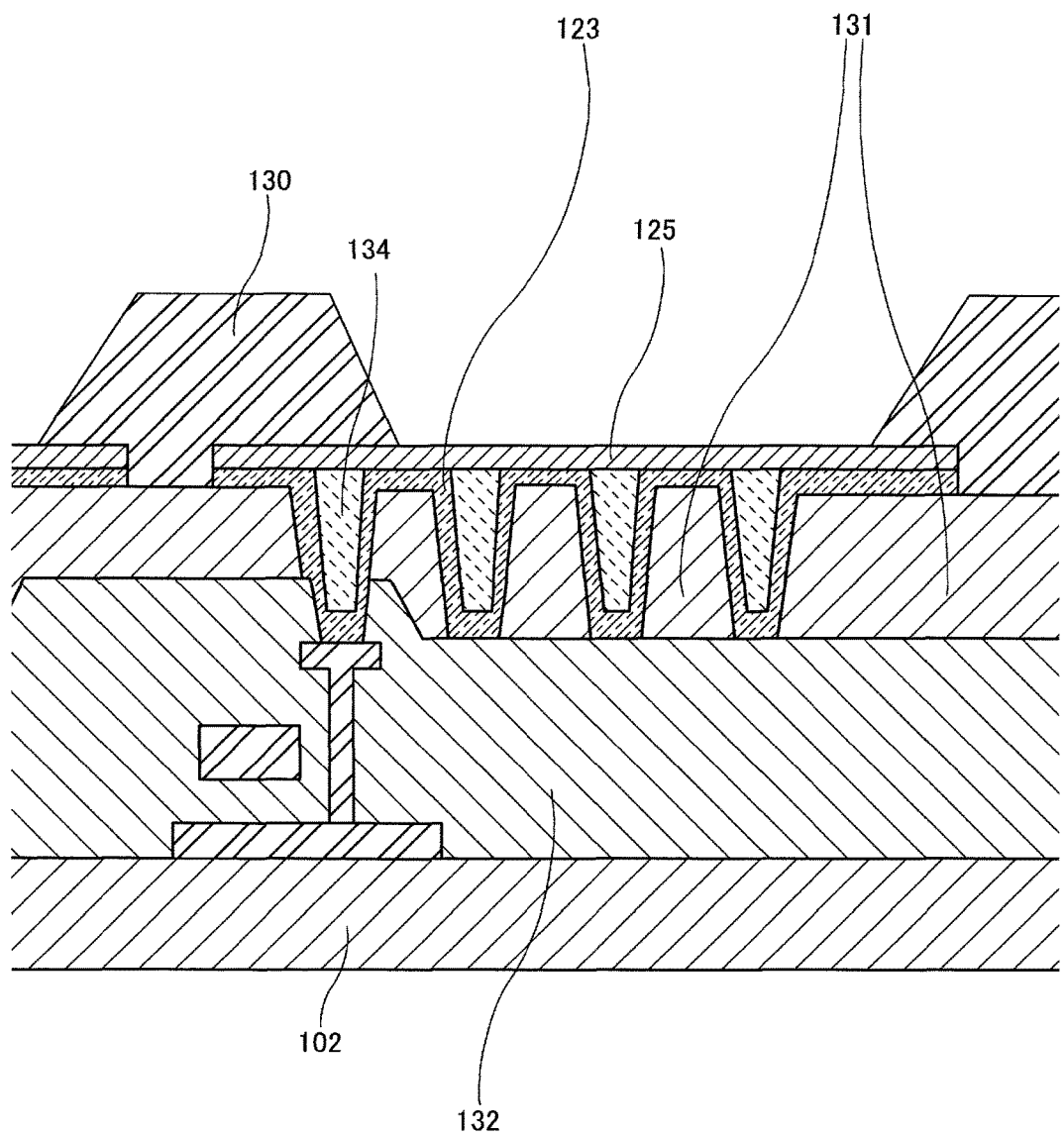
FIG. 15 is a cross-sectional view illustrating the manufacturing method of the display device in the embodiment according to the present invention.

Two adjacent pixels 108 are demarcated from each other, and the bank 130 is formed such that an end of the bank 130 covers a peripheral area of the individual pixel electrode 124 (FIG. 15). The bank 130 is formed of an insulating material. The insulating material may be an organic material or an inorganic material. Preferably usable organic materials include polyimide, an acrylic resin and the like. Preferably usable inorganic materials include silicon oxide and the like.

Figure 16:
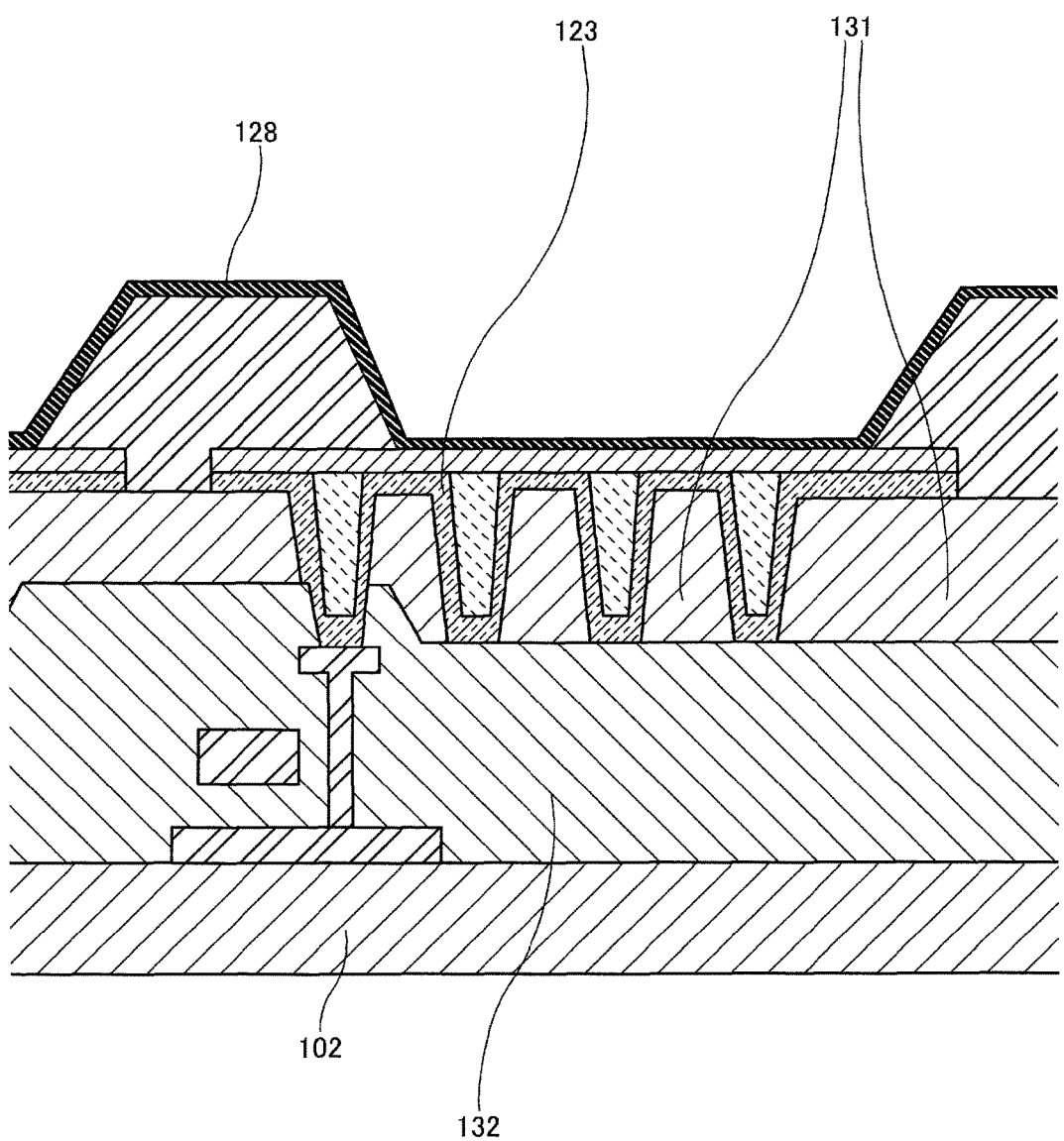
FIG. 16 is a cross-sectional view illustrating the manufacturing method of the display device in the embodiment according to the present invention.

On the resultant structure, the light emitting layer 128 is formed (FIG. 16). In this embodiment, merely the light emitting layer 128 is formed on the resultant structure. Alternatively, in the case where the light emitting element 120 is an organic EL element, functional layers such as, for example, an electron injection layer, an electron transfer layer, a hole injection layer and a hole transfer layer may also be formed by vapor deposition by use of the same vapor deposition mask as used for forming the light emitting layer 128.

Figure 17:
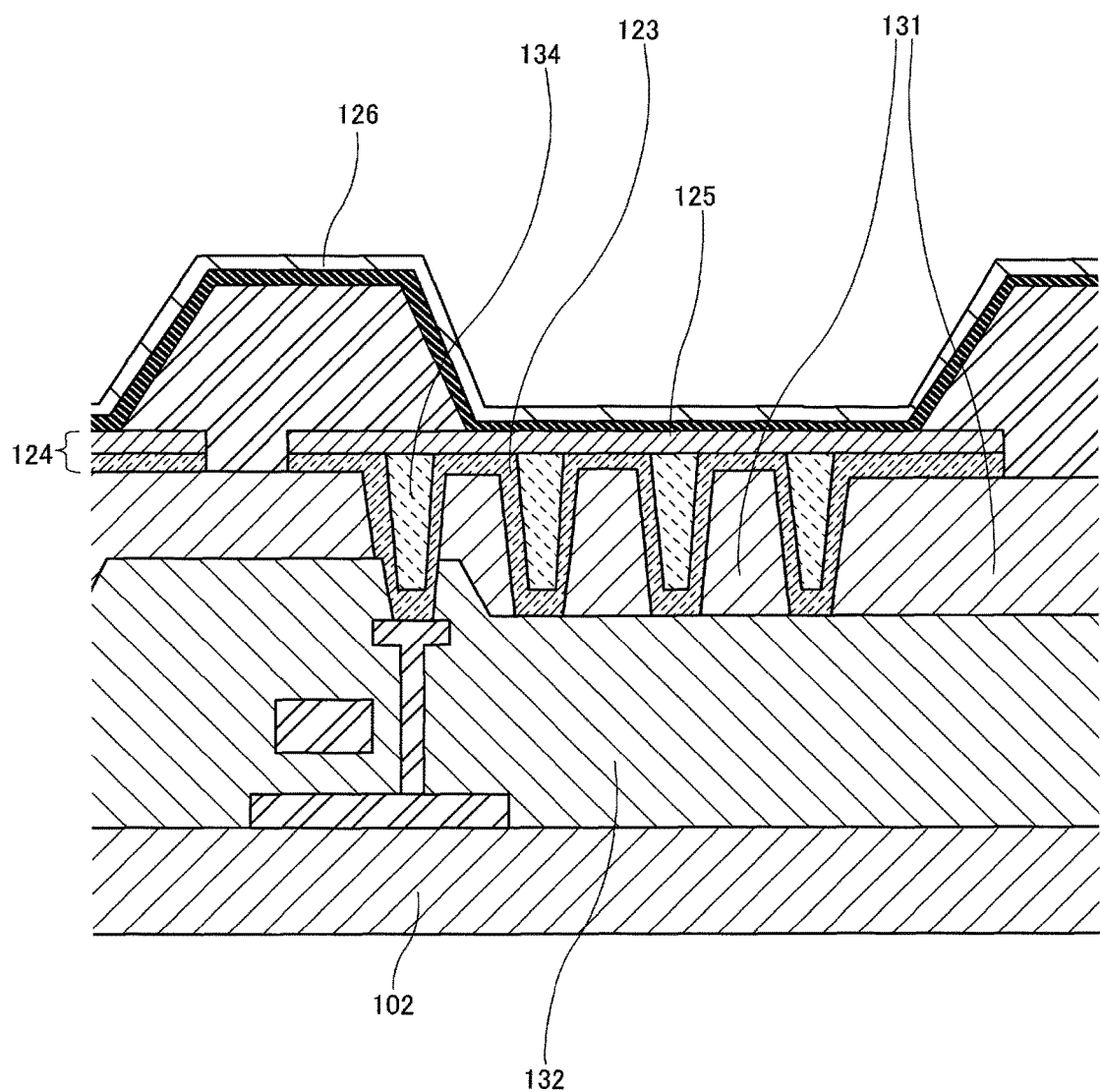
FIG. 17 is a cross-sectional view illustrating the manufacturing method of the display device in the embodiment according to the present invention.

On the light emitting layer 128, the common pixel electrode 126, which is an upper electrode, is formed (FIG. 17). The common pixel electrode 126 is preferably formed of a transparent conductive material that is light-transmissive and conductive such as ITO (tin oxide-containing indium oxide), IZO (indium oxide—zinc oxide) or the like in order to allow light emitted in the light emitting layer 128 to be transmitted through the common pixel electrode 126. In this embodiment, the common pixel electrode 126 is formed of ITO. On the common pixel electrode 126, the protective film 136 is formed. Thus, the manufacturing of the structure shown in FIG. 12 is finished. As described in embodiment 1, the protective film 136 may include a plurality of films.

In this embodiment, merely the light emitting layer 128 is formed on the bank 130 and the light-transmissive conductive film 125. Alternatively, in the case where the light emitting element 120 is an organic EL element, functional layers such as, for example, an electron injection layer, an electron transfer layer, a hole injection layer and a hole transfer layer may also be formed by vapor deposition by use of the same vapor deposition mask as used for forming the light emitting layer 128.

In this embodiment, the first insulating film 132 and the second insulating film 131 are provided between the transistor 118 and the light emitting element 120. This allows the recessed portions 133 that are sufficiently deep to run through the second insulating film 131 to be provided. As a result, large convexed and concaved portions are provided.

In this embodiment, the transistor 118 and the light emitting element 120 are insulated, except for the contact portion thereof, from each other by the first insulating film 132, and large convexed and concaved portions are formed in the second insulating film 131 in the pixel 108. This allows the individual pixel electrode 124 (reflective film 123) to be formed along the convexed and concaved portions. Therefore, the amount of light that is scattered is increased, and thus the light extraction efficiency is improved.

The contact hole and the convexed and concaved portions are formed in the second insulating film 131 in the same step. Therefore, the convexed and concaved portions are made high in correspondence with the depth of the contact hole 119. This increases the amount of light that is scattered and thus improves the light extraction efficiency, and decreases the amount of external light that is reflected.

In addition, a light component emitted in the recessed portions 133 is not output in a lateral direction (left-right direction in a cross-sectional view shown in FIG. 12). Therefore, in a system in which a white organic light emitting element and color filters are combined, optical color mixing is decreased.

In the case where a light emitting layer is formed by vapor deposition on a reflective film having a convexed and concaved structure, the pressure resistance may possibly be decreased at ends and inclining portions of the convexed portions and the concaved portions. By contrast, in this embodiment, the light emitting layer 128 is flattened. This provides an effect that the decrease in the pressure resistance is prevented.

The formation of the contact hole 119 through which the reflective film 123 and the transistor 118 are connected with each other, and the formation of the recessed portions 133 in the second insulating film 131, are performed in the same step. Therefore, the organic light emitting element that improves the light extraction efficiency and reduces the amount of external light that is reflected is manufactured without separately performing the step of forming the convexed and concaved portions in the second insulating film 131.

Modification 1

Figure 18:
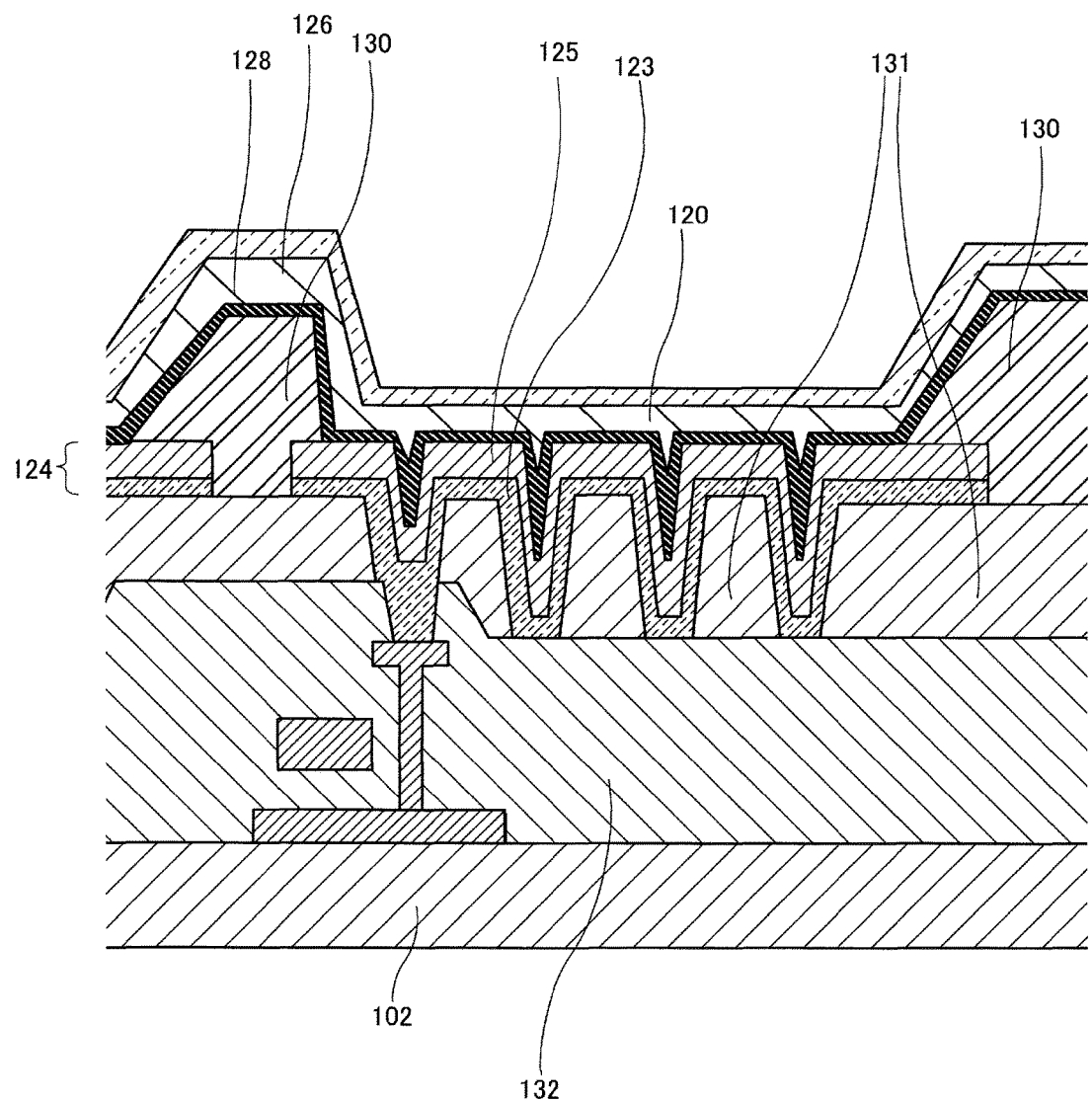
FIG. 18 is a cross-sectional view illustrating a manufacturing method of a display device in an embodiment according to the present invention.

In embodiment 1 and the manufacturing method of the display device 100 in embodiment 1, the bank 130 may be formed so as not to overlap the contact portion between the transistor 118 and the reflective film 123. Namely, the light emitting layer 128 and the individual pixel electrode 124 are in contact with each other also above the contact hole 119, so that a region above the contact hole 119 also acts as a light emitting region (FIG. 18).

In this modification, the bank 130 is formed so as not to overlap the contact portion between the transistor 118 and the reflective film 123, and thus the light emitting region of the light emitting film 128 is expanded. This is advantageous especially for high definition products. In addition, the current density is decreased as the numerical aperture defined by the bank is increased. This allows the life of the organic light emitting element to be extended.

Modification 2

Figure 19:
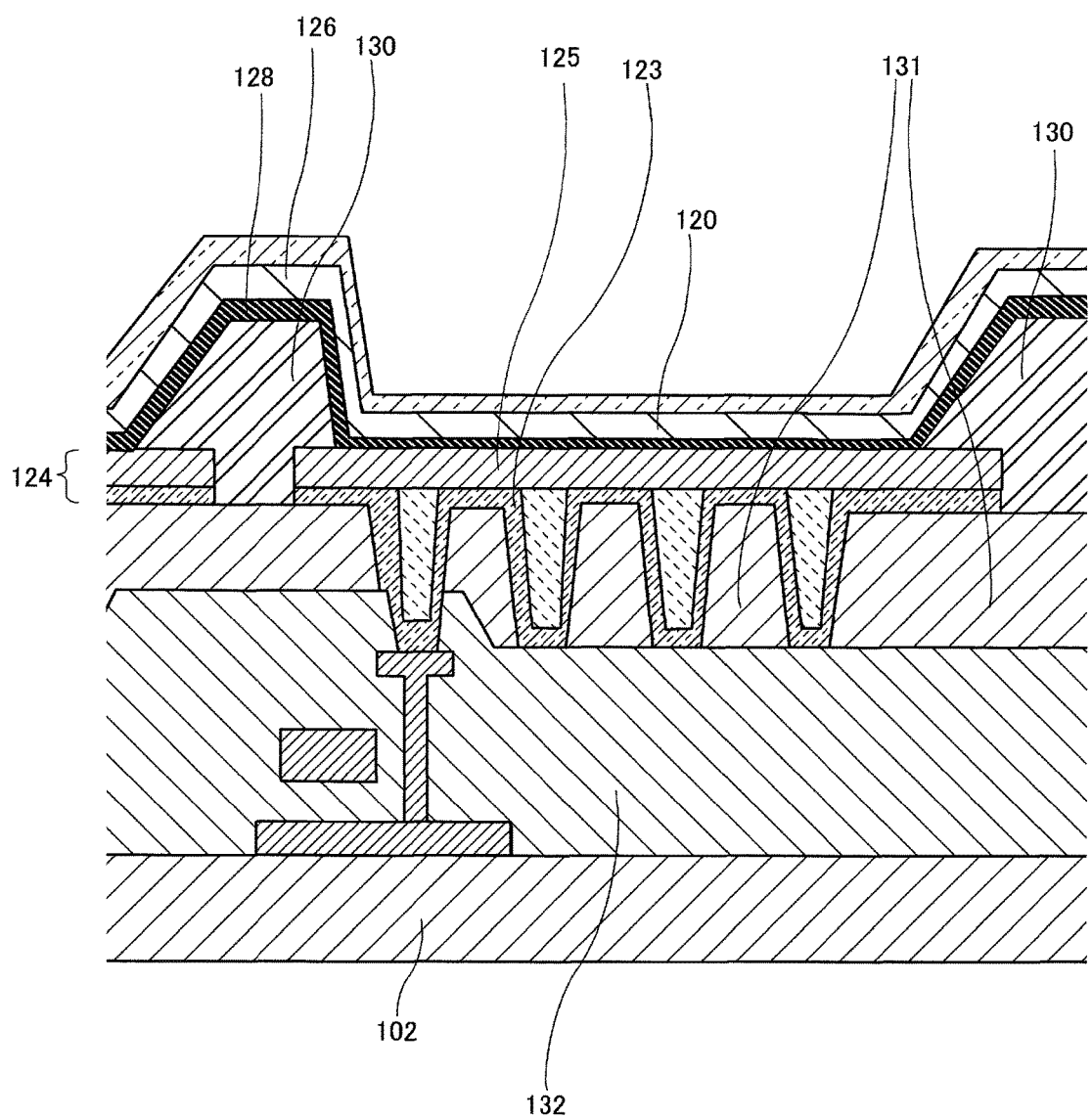
FIG. 19 is a cross-sectional view illustrating a manufacturing method of a display device in an embodiment according to the present invention.

In embodiment 2 and the manufacturing method of the display device 100 in embodiment 2, the bank 130 may be formed so as not to overlap the contact portion between the transistor 118 and the reflective film 123. Namely, the light emitting layer 128 and the individual pixel electrode 124 are in contact with each other also above the contact hole 119, so that a region above the contact hole 119 also acts as a light emitting region (FIG. 19).

In this modification, the bank 130 is formed so as not to overlap the contact portion between the transistor 118 and the reflective film 123, and thus the light emitting region of the light emitting film 128 is expanded. This is advantageous especially for high definition products. In addition, the current density is decreased as the numerical aperture defined by the bank is increased. This allows the life of the organic light emitting element to be extended.

The display device 100 in preferable embodiments of the present invention has been described. The above-described embodiments are merely examples, and the technological scope of the present invention is not limited to any of the above-described embodiments. A person of ordinary skill in the art would make various alterations without departing from the gist of the present invention, which is defined in the claims. Therefore, such alterations are to be construed to be encompassed in the technological scope of the present invention.

The invention claimed is:

1. A display device comprising:
a substrate;
a transistor provided on the substrate;
a first insulating film provided on the substrate and the transistor;
a second insulating film provided on the first insulating film;
a pixel electrode provided on the second insulating film;
a light emitting layer provided on the pixel electrode;
a common electrode provided on the light emitting layer; and
a contact hole in the first insulating film and the second insulating film and connecting a source or a drain of the transistor with the pixel electrode,
wherein the second insulating film has at least one first recessed portion passing through the second insulating film and reaching the first insulating film, and
the pixel electrode is provided along a top surface of the second insulating film and the first recessed portion.

2. The display device according to claim 1, wherein the pixel electrode includes a reflective film and a light-transmissive conductive film provided on the reflective film.

3. The display device according to claim 2, wherein the reflective film is provided along the first recessed portion and has a second recessed portion along the first recessed portion,
the display device further includes a recessed portion filling film filling the second recessed portion, the recessed portion filling film being provided on and in contact with the reflective film, and
the light-transmissive conductive film is in contact with the recessed portion filling film at a position overlapping the second recessed portion.

4. The display device according to claim 1, wherein the light emitting layer is in contact with the pixel electrode over the contact hole.

5. The display device according to claim 1, comprising a first pixel; a second pixel adjacent to the first pixel; and a bank located at a border between the first pixel and the second pixel,
wherein the first pixel includes the transistor, the pixel electrode, and the contact hole, and
the contact hole is located at a position not overlapping the bank as seen in a plan view.

6. The display device according to claim 1, wherein the first recessed portion and the contact hole are different in position from each other.

7. The display device according to claim 1, wherein the first recessed portion is spaced from the transistor.

8. The display device according to claim 1, wherein a depth of the first recessed portion is equal to a thickness of the second insulating film.

9. The display device according to claim 1, wherein the pixel electrode comprises a second recessed portion.

10. The display device according to claim 1, wherein the pixel electrode further comprises more than one second recessed portions.

11. A display device comprising:
a substrate;
a first pixel provided on the substrate, the first pixel including a light emitting region;
a second pixel adjacent to the first pixel; and
a bank located at a border between the first pixel and the second pixel, the bank exposing the light emitting region,
wherein the first pixel includes a transistor provided on the substrate, a reflective film in contact with the transistor, a lower electrode in contact with the reflective film, a light emitting layer provided on the lower electrode, and an upper electrode provided on the light emitting layer, the display device further includes:
- a first insulating film provided on the substrate, the first insulating film covering the transistor;
- a second insulating film provided on the first insulating film; and
- a contact hole in the first insulating film and the second insulating film, the reflective film is in contact with the transistor through the contact hole, the second insulating film has a first recessed portion at a position overlapping the light emitting region, the first recessed portion passing through the second insulating film to expose the first insulating film, and the reflective film is in contact with the second insulating film along the first recessed portion.

12. The display device according to claim 11, wherein the reflective film has a second recessed portion along the first recessed portion; and
- the lower electrode is in contact with the reflective film along the second recessed portion.

13. The display device according to claim 11, wherein the reflective film has a second recessed portion along the first recessed portion; and
- the second recessed portion is filled with a third insulating film.

14. The display device according to claim 13, wherein the lower electrode is in contact with the third insulating film at a position overlapping the second recessed portion.

15. The display device according to claim 12, wherein the contact hole is located at a position overlapping the light emitting region as seen in a plan view.

16. The display device according to claim 12, wherein the contact hole is located at a position not overlapping the bank as seen in a plan view.

17. The display device according to claim 12, wherein a plurality of first recessed portions including the first recessed portion are provided in the second insulating film.

* * * * *